(12) United States Patent
Yang et al.

(10) Patent No.: US 10,388,862 B1
(45) Date of Patent: Aug. 20, 2019

(54) HIGHLY SELECTIVE ION BEAM ETCH HARD MASK FOR SUB 60NM MRAM DEVICES

(71) Applicant: Taiwan Semiconductor Manufacturing Company, Ltd., Hsinchu (TW)

(72) Inventors: Yi Yang, Fremont, CA (US); Dongna Shen, San Jose, CA (US); Yu-Jen Wang, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/951,873

(22) Filed: Apr. 12, 2018

(51) Int. Cl.
  *H01L 27/22* (2006.01)
  *H01L 43/02* (2006.01)
  *H01L 43/08* (2006.01)
  *H01L 43/12* (2006.01)

(52) U.S. Cl.
  CPC ............ *H01L 43/12* (2013.01); *H01L 27/222* (2013.01); *H01L 43/02* (2013.01); *H01L 43/08* (2013.01)

(58) Field of Classification Search
  None
  See application file for complete search history.

(56) References Cited

U.S. PATENT DOCUMENTS

| 8,008,095 | B2 | 8/2011 | Assefa et al. | |
| 8,324,698 | B2 | 12/2012 | Zhong et al. | |
| 8,524,511 | B1 * | 9/2013 | Zhong | H01L 43/12 257/421 |
| 8,883,520 | B2 | 11/2014 | Satoh et al. | |
| 2012/0326250 | A1 * | 12/2012 | Gaidis | H01L 43/08 257/421 |
| 2018/0040668 | A1 | 2/2018 | Park et al. | |

OTHER PUBLICATIONS

Co-pending U.S. Pat. No. HT18-003, U.S. Appl. No. 15/947,512, filed Apr. 6, 2018, "Ion Beam Etching Fabricated Sub 30NM Vias to Reduce Conductive Material Re-deposition for Sub 60NM MRAM Devices," by Yi Yang et al., 17 pgs.

* cited by examiner

*Primary Examiner* — Thien F Tran
(74) *Attorney, Agent, or Firm* — Haynes and Boone, LLP

(57) ABSTRACT

A via connection is provided through a dielectric layer to a bottom electrode. A MTJ stack is deposited on the dielectric layer and via connection. A top electrode is deposited on the MTJ stack. A selective hard mask and then a dielectric hard mask are deposited on the top electrode. The dielectric and selective hard masks are patterned and etched. The dielectric and selective hard masks and the top electrode are etched wherein the dielectric hard mask is removed. The top electrode is trimmed using IBE at an angle of 70 to 90 degrees. The selective hard mask, top electrode, and MTJ stack are etched to form a MTJ device wherein over etching into the dielectric layer surrounding the via connection is performed and re-deposition material is formed on sidewalls of the dielectric layer underlying the MTJ device and not on sidewalls of a barrier layer of the MTJ device.

4 Claims, 3 Drawing Sheets

HIGHLY SELECTIVE ION BEAM ETCH HARD MASK FOR SUB 60NM MRAM DEVICES

RELATED PATENT APPLICATION

This application is related to co-pending U.S. patent application Ser. No. 15/947,512 filed on Apr. 6, 2018, assigned to the same assignee as the present application and herein incorporated by reference in its entirety.

TECHNICAL FIELD

This application relates to the general field of magnetic tunneling junctions (MTJ) and, more particularly, to etching methods for forming sub 60 nm MTJ structures.

BACKGROUND

Fabrication of magnetoresistive random-access memory (MRAM) devices normally involves a sequence of processing steps during which many layers of metals and dielectrics are deposited and then patterned to form a magnetoresistive stack as well as electrodes for electrical connections. To define the magnetic tunnel junctions (MTJ) in each MRAM device, precise patterning steps including photolithography and reactive ion etching (RIE), ion beam etching (IBE), or their combination are usually involved. During RIE, high energy ions remove materials vertically in those areas not masked by photoresist, separating one MTJ cell from another. However, the high energy ions can also react with the non-removed materials, oxygen, moisture, and other chemicals laterally, causing sidewall damage and lowering device performance.

To solve this issue, pure physical etching techniques such as ion beam etching (IBE) have been applied to etch the MTJ stack. However, due to the non-volatile nature, IBE etched conductive materials in the MTJ and the bottom electrode can be re-deposited into the tunnel barrier, resulting in shorted devices. Two approaches are usually applied to solve this issue. The first is to use high angle IBE to trim the MTJ sidewall to remove any re-deposition. The other solution is to greatly etch the MTJ so that the re-deposition can be confined below the tunnel barrier, without creating a shorting path. Both of these approaches require the MTJ hard mask to be very thick because this physical type of etch is not selective. However, this brings challenges for photolithography since a thick hard mask would require very thick photoresist, the patterns of which can easily collapse, especially when the size goes down to sub 60 nm. A new approach to enhance the IBE selectivity is needed to fully utilize the benefit of this technique.

Several patents teach methods of MTJ etching, including U.S. Pat. No. 8,324,698 (Zhong et al) and U.S. Pat. No. 8,008,095 (Assefa et al) and U.S. Patent Application 2018/0040668 (Park et al). These references are different from the present disclosure.

SUMMARY

It is an object of the present disclosure to provide an improved method of forming MTJ structures having without re-deposition of metal materials on the tunnel barrier layer.

Another object of the present disclosure is to provide a selective physical MTJ etching method.

Yet another object of the present disclosure is to provide a selective physical etching method for forming MTJ structures and a great over etch to avoid re-deposition of metal materials on the tunnel barrier layer.

A further object is to provide a selective physical etching method for forming MTJ structures and a great over etch as well as sidewall trimming can be applied to remove the conductive material re-deposition on the sidewall, reducing electrically shorted devices.

A still further object is to provide method of forming a dielectric-enclosed via connection between the bottom electrode and overlying MTJ structures wherein the via connection is narrower than the MTJ stack pattern and to provide a selective physical etching method for forming MTJ structures and a great over etch as well as sidewall trimming can be applied to remove the conductive material re-deposition on the sidewall, reducing electrically shorted devices.

In accordance with the objectives of the present disclosure, a method for etching a magnetic tunneling junction (MTJ) structure is achieved. A via connection is provided through a dielectric layer to a bottom electrode. A MTJ stack is deposited on the dielectric layer and the via connection. A top electrode is deposited on the MTJ stack. A selective hard mask is deposited on the top electrode. A dielectric hard mask is deposited on the selective hard mask. The dielectric and selective hard masks are patterned and etched. Thereafter, the dielectric and selective hard masks and the top electrode are etched wherein the dielectric hard mask is removed. The top electrode is trimmed using ion beam etching (IBE) at an angle of 70 to 90 degrees with respect to a normal line of a top surface of the top electrode. The selective hard mask, top electrode, and MTJ stack are etched wherein over etching is performed wherein a MTJ device is formed and wherein the dielectric layer surrounding the via connection is etched into and wherein re-deposition material is formed on sidewalls of the dielectric layer underlying the MTJ device and not on sidewalls of a barrier layer of the MTJ device.

Also in accordance with the objects of the present disclosure, a magnetic tunneling junction (MTJ) is achieved comprising a sub-60 nm MTJ device and a bottom electrode underlying the MTJ device and connected to the MTJ device by a metal via through a dielectric layer wherein the metal via has a width at least 5 nm narrower than the MTJ device.

BRIEF DESCRIPTION OF THE DRAWINGS

In the accompanying drawings forming a material part of this description, there is shown.

DETAILED DESCRIPTION

In the current art, the MTJ hard mask stack does not have any layer that is very resistive to the physical type of etch such as pure Ar RIE or IBE. This makes it challenging to pattern sub 60 nm devices. In the process of the present disclosure, we add materials such as carbon, which has a very low etch rate under ion beam etching, to the original hard mask stack. This thin hard mask layer ensures that it can be patterned by a thin photoresist, but still protect the whole MTJ during the later IBE process. That is, this process changes the nature of IBE from non-selective to selective etching. As a result, a great IBE over etch as well as sidewall trimming can be applied to remove the conductive material re-deposition on the sidewall, reducing electrically shorted devices.

Furthermore, by using a high angle ion beam etching (IBE) as disclosed in co-pending U.S. patent application Ser. No. 15/947,512, we can create sub 30 nm vias connecting the bottom electrode and sub 60 nm MTJ. These small vias are surrounded by dielectric materials and smaller than the MTJ, so that the conductive material re-deposition from the bottom electrode during MTJ etch can be avoided. A great over etch also becomes possible to confine the overall conductive material re-deposition from the MTJ stack below the MTJ junction, effectively reducing the shorted devices. The process of the present disclosure results in great pattern integrity and device yield.

Figure 1:
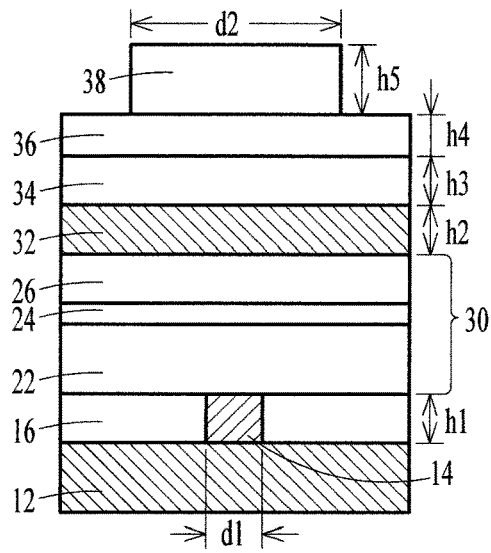
FIGS. 1 through 7 illustrate in cross-sectional representation steps in a preferred embodiment of the present disclosure.

The preferred embodiment of the present disclosure will be described in more detail with reference to FIGS. 1-7. FIG. 1 illustrates a bottom electrode layer 12 formed on a semiconductor substrate, not shown. Metal via 14 surrounded by dielectric material 16 is formed on top of the bottom electrode to a height h1 of >=45 nm. These small size vias, having a pattern size d1 of between about 20 to 30 nm, can be fabricated by 248 nm photolithography, followed by RIE or IBE trimming. They can also be fabricated by immersion 193 nm or EUV photolithography. The metal vias 14 may comprise Ta, TaN, Ti, TiN, W, Cu, Mg, Ru, Cr, Co, Fe, Ni or their alloys. The surrounding dielectric materials can be $SiO_2$, SiN, SiON, SiC, or SiCN.

MTJ film layers are deposited, typically including a seed layer, a pinned layer, a barrier layer, a free layer, and a cap layer, for example. These layers form the MTJ film stack 30. Pinned layer 22, barrier layer 24, and free layer 26 are identified in FIG. 1.

The top electrode layer 32, such as Ta, TaN, Ti, TiN, W, Cu, Mg, Ru, Cr, Co, Fe, Ni or their alloys with thickness h2 of 10 to 100 nm and preferably ≥50 nm, is deposited on the MTJ stack 30. Next, a hard mask layer 34 which is highly resistive to IBE is deposited onto the top electrode 32 to a thickness h3 of ≥50 nm. Some examples of this hard mask layer are CVD deposited or spin-on carbon, CVD deposited TaC, and PVD deposited Al or Be.

Table 1 below is from http://www.microfabnh.com/ion_beam_etch_rates.php. As shown in Table 1, the IBE etch rate of carbon (C) is only approximately 60 Angstroms/minute, much lower than other commonly used metals in the MTJ hard mask and stack, the IBE etch rates of which are larger than 200 A/min. TaC, Al, and Be also have low etch rates, as can be seen in the table.

TABLE 1

| Material | Etch Rate (A/min) |
| --- | --- |
| Ag | 1050 |
| Al | 48 |
| Au | 630 |
| Az 1350 | 117 |
| Be | 76 |
| C | 64 |
| CdS | 1283 |
| Co | 262 |
| Cr | 309 |
| Cu | 513 |
| Fe | 204 |
| Si | 216 |
| SiC | 204 |
| SiO2 | 192 |
| Hf | 385 |
| InSb | 887 |
| Ir | 344 |
| Ge | 537 |
| Mg | 131 |
| Mn | 507 |

TABLE 1-continued

| Material | Etch Rate (A/min) |
| --- | --- |
| Mo2C | 163 |
| Nb | 274 |
| Ni | 309 |
| NiCr | 309 |
| Pb | 1517 |
| PbTe | 2199 |
| Pd | 642 |
| Pt | 362 |
| Rb | 2333 |
| Re | 303 |
| Rh | 420 |
| Riston 14 | 146 |
| Ru | 356 |
| Sb | 1889 |
| Ni80Fe20 | 292 |
| Ni | 309 |
| Zr | 332 |
| Ta | 245 |
| Ta2O5 | 350 |
| TaC | 87 |
| TaN | 233 |
| Ti | 192 |
| Ti or TiW | 195 |
| W | 198 |
| Y | 554 |
| Zr | 332 |

Next a thin dielectric layer 36 such as SiON, SiN, $SiO_2$, SiC or SiCN with thickness h4 (≥90 nm) is deposited onto the carbon layer 34. Finally, photoresist 38 is patterned by 248 nm photolithography, forming patterns with size d2 (approximately 70 to 80 nm) and height h5 of ≥200 nm.

Figure 2:
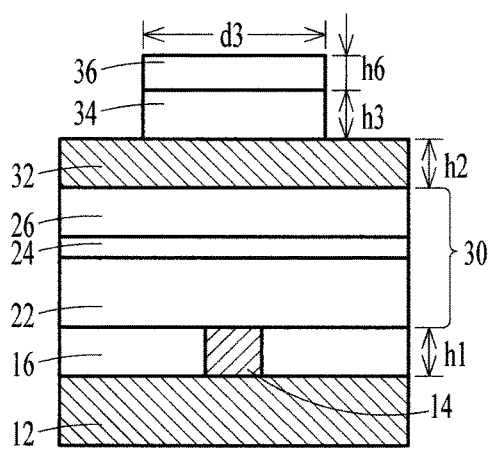

Now, referring to FIG. 2, the thin dielectric layer 36 is etched by RIE etching using fluorine carbon based plasma such as $CF_4$ or $CHF_3$ alone, or mixed with Ar and $N_2$. $O_2$ can be added to reduce the pillar size further. Alternatively, the thin dielectric layer 36 could be patterned by a physical type of etch such as IBE using Ar plasma.

Now, the hard mask 34 is etched. If carbon is used as the IBE resistive hard mask 34, $O_2$ alone or mixed with a halogen such as $Cl_2$ and HBr can be used to etch the hard mask 34, reducing the pattern size to d3, between about 60 and 70 nm. A halogen based plasma such as $Cl_2$ alone, or mixed with Ar and HBr can be used if TaC, Al, or Be are used as the hard mask 34. The remaining photoresist 38 on top of the thin dielectric layer 36 should be totally consumed during this etching step and the dielectric mask 36 height is reduced to h6, between about 80 and 90 nm.

Figure 3:
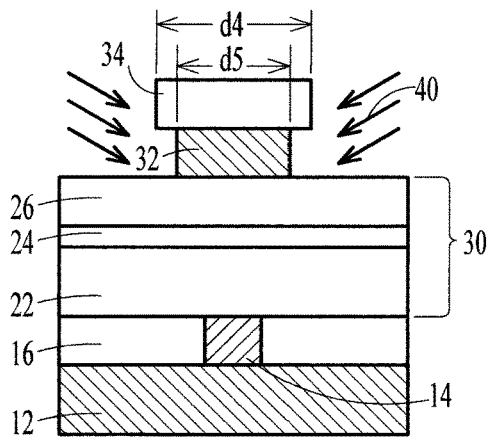

Next, referring to FIG. 3, the top electrode 32 is etched by RIE using fluorine carbon such as $CF_4$ or hydrogen such as $Cl_2$. Alternatively, the top electrode may be etched by IBE. This etching removes the dielectric mask layer 36 and reduces the pattern size to d4, between about 60 to 70 nm, about the same as d3 in FIG. 2.

With a high angle IBE trimming 40 such as 70 to 90° with respect to the surface's normal line, as shown in FIG. 3, the top electrode 32 pattern size decreases to d5, which can range from 50-60 nm, dependent on the IBE trimming conditions such as power (500-1000 W) and time (100-300 seconds). Due to the protection of the carbon layer 34 on top, the remaining top electrode height h2 stays the same after this step. The height of the carbon layer 34 is reduced to h7, between about 5 and 20 nm.

Figure 4:
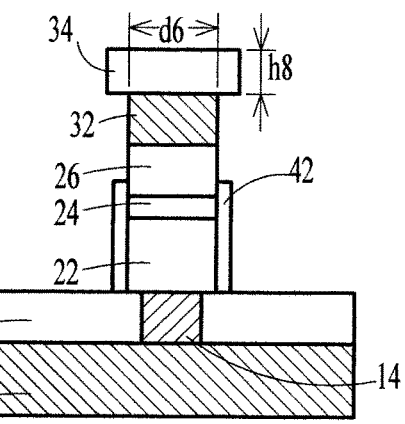

Referring now to FIG. 4, the MTJ stack 30 is etched by RIE, IBE, or their combination. If the patterning stops right after the pinned layer (PL) 22 is etched, the non-volatile conductive material re-deposition 42 from the MTJ itself would cover the tunnel barrier 24, resulting in electrically shorted devices. Pattern size d6 is now between about 50 and 60 nm. However in the process of the present disclosure, a great over etch can be applied without introducing more re-deposition from the bottom electrode, because the sub 30 nm vias underneath are overlaid by the MTJ and surrounded by dielectric material.

Figure 5:
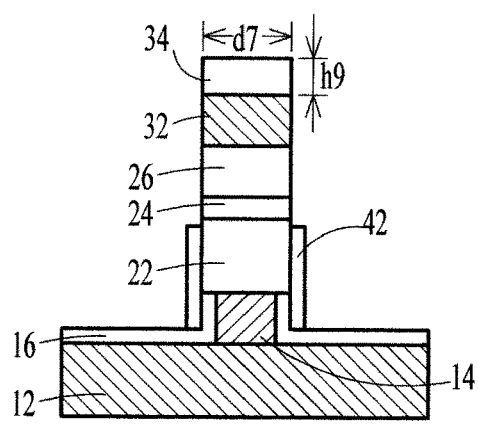

FIG. 5 illustrates the stack after the over etch. The material re-deposition on the tunnel barrier layer 24 has been removed by the over etch and further material re-deposition 42 is formed on sidewalls below the tunnel barrier layer 24. The final MTJ size d7 is about 50 to 60 nm.

Figure 6:
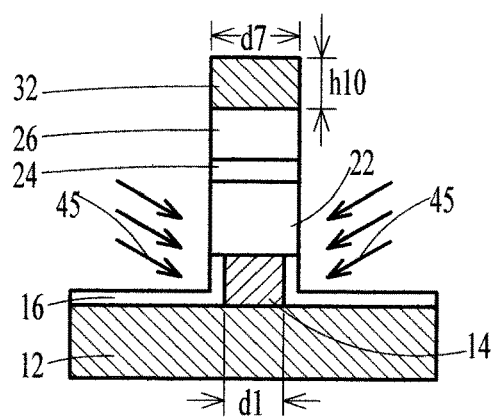

To further remove the electrical shorting, an additional ex-situ or in-situ IBE trimming 45 at large angle of 70 to 90 degrees can be applied to remove the MTJ sidewall re-deposition 42, as illustrated in FIG. 6. For in situ IBE trimming, wafers are transferred from the previous main etch step to the later trimming step continually without breaking vacuum, so that the vias are not exposed to the air to oxidize. For ex situ, the transfer step is done under atmosphere. In situ IBE trimming is preferred here since the MTJ stack is not exposed to water and oxygen damage in atmosphere. However, this brings a higher requirement for tools. When in-situ IBE trimming is not available, ex-situ trimming will work since the damaged layer should be at least partially removed by the trimming step. After IBE trimming, the final MTJ size d8 is about 40-50 nm.

During the whole etching process, the top electrode is protected by the carbon on top so that the whole device integrity is preserved. With or without the optional IBE trimming, the MTJ is at least 5 nm larger than the vias 14 underneath so that the photolithography overlay margin is covered.

Figure 7:
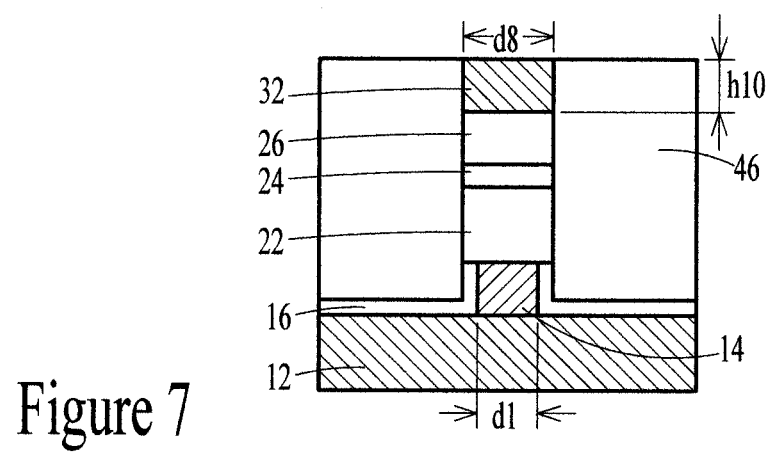

After patterning, the whole device can be encapsulated by dielectric or metal oxide such as $SiO_2$, SiN, SiON, SiC, SiCN, $Al_2O_3$ and MgO 46, as shown in FIG. 7. Either ex-situ or in-situ encapsulation may be used. A final CMP step is applied to flatten the surface and expose the top electrode, as well as removing any remaining carbon hard mask left from previous IBE steps. The top electrode 32 could alternatively be exposed by RIE to etch back the encapsulation material and remaining carbon mask. This RIE etch back process uses a carbon fluorine plasma such as $CF_4$, $CHF_3$, $CH_2F_2$, $C_4F_8$ mixed with $O_2$. Alternatively, a halogen plasma such as $Cl_2$ mixed with $O_2$ could be used. The added $O_2$ helps strip away the remaining carbon hard mask. The height of the top electrode is h10, remaining the same as the as-deposited height h2.

The process of the present disclosure changes the IBE process from non-selective to selective, so that it combines the benefit of chemical and physical etches; i.e., the MTJ can be physically etched without introducing chemical damage to the MTJ sidewall, but preserves great pattern integrity similar to what a chemical etch can provide. It therefore becomes possible to carry out a great IBE over etch as well as high angle sidewall trimming to greatly reduce electrically shorted devices. RIE can be very selective with the proper plasma species but it causes more chemical damage on the MTJ sidewall due to chemical reaction. IBE is a physical etch, bringing no chemical damage. The selective IBE etching of the present disclosure is preferable to RIE etching since the process of the present disclosure solves the problem of metal re-deposition.

The process of the present disclosure will be used for MRAM chips of size smaller than 60 nm as problems associated with chemically damaged sidewalls and re-deposition from the bottom electrode become very severe for these smaller sized MRAM chips.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A magnetic tunneling junction (MTJ) comprising:
    a sub-60 nm MTJ device; and
    a bottom electrode underlying said MTJ device and connected to said MTJ device by a metal via through a dielectric layer wherein said metal via has a width at least 5 nm narrower than said MTJ device wherein any metal re-deposition material lies on sidewalls of said dielectric layer and said MTJ device below a tunneling barrier layer.

2. The MTJ according to claim 1 wherein said metal via comprises Ta, Ti, TaN, TiN, W, Cu, Mg, Ru, Cr, Co, Fe, Ni or their alloys having a width of less than 30 nm.

3. The MTJ according to claim 1 wherein said dielectric layer comprises $SiO_2$, SiN, SiON, SiC or SiCN.

4. The MTJ according to claim 1 further comprising:
    a top electrode on said MTJ device; and
    an encapsulation of said MTJ device and said top electrode with a dielectric or metal oxide comprising $SiO_2$, SiN, SiON, SiC, SiCN, $Al_2O_3$ or MgO.

* * * * *